(12) United States Patent
Johnson

(10) Patent No.: US 9,995,796 B1
(45) Date of Patent: Jun. 12, 2018

(54) IDENTIFYING AN ARC-FAULT TYPE IN PHOTOVOLTAIC ARRAYS

(71) Applicant: National Technology & Engineering Solutions of Sandia, LLC, Albuquerque, NM (US)

(72) Inventor: Jay Johnson, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 584 days.

(21) Appl. No.: 14/286,537

(22) Filed: May 23, 2014

Related U.S. Application Data

(60) Provisional application No. 61/826,651, filed on May 23, 2013.

(51) Int. Cl.
*G01R 31/40* (2014.01)
*H01L 31/042* (2014.01)
*G01J 1/44* (2006.01)

(52) U.S. Cl.
CPC ........ *G01R 31/405* (2013.01); *H01L 31/0428* (2013.01); *G01J 2001/4413* (2013.01)

(58) Field of Classification Search
CPC ...... H02H 1/0015; H02H 1/003; H02H 3/087; H02S 50/10; H02S 50/00; G01R 31/02; G01R 31/024
USPC ................................................. 324/536, 522
See application file for complete search history.

(56) References Cited

U.S. PATENT DOCUMENTS

| 8,179,147 | B2 | 5/2012 | Dargatz et al. | |
| 2011/0019444 | A1* | 1/2011 | Dargatz | H02H 1/0015 363/50 |
| 2012/0134058 | A1* | 5/2012 | Pamer | G01R 31/1227 702/58 |
| 2012/0174961 | A1* | 7/2012 | Larson | H01L 31/02021 136/246 |
| 2014/0095086 | A1* | 4/2014 | Parker | H02H 3/087 702/58 |
| 2014/0373894 | A1* | 12/2014 | Stratakos | H02S 50/00 136/244 |

OTHER PUBLICATIONS

Jack Flicker and Jay Johnson, "Electrical simulations of series and parallel PV arc-faults," 39th IEEE PVSC, Tampa Bay, FL, Jun. 16-21, 2013.
C. Strobl and P. Meckler, "Arc Faults in Photovoltaic Systems," Proceedings of the 56th IEEE Holm Conference on Electrical Contacts, pp. 1-7, Oct. 4-7 2010.

* cited by examiner

*Primary Examiner* — Vincent Q Nguyen
(74) *Attorney, Agent, or Firm* — Daniel J. Jenkins

(57) ABSTRACT

An apparatus, method, and system for detecting arc-faults in a photovoltaic array are disclosed. Further, the detection not only identifies that an arc-fault is present in the array, but also classifies whether the arc-fault is a series type arc-fault or a parallel type arc-fault. Upon determination of the specific type of arc-fault that is at issue, de-energizing the arc-fault specific to the type is selected and carried out.

12 Claims, 8 Drawing Sheets

IDENTIFYING AN ARC-FAULT TYPE IN PHOTOVOLTAIC ARRAYS

CROSS-REFERENCE TO RELATED APPLICATIONS

This application claims the benefit of the earlier filing date of U.S. Provisional Patent Application No. 61/826,651, entitled "CLASSIFICATION OF PARALLEL AND SERIES ARC-FAULTS IN PHOTOVOLTAIC ARRAY" filed May 23, 2013 and incorporated herein by reference.

GOVERNMENT RIGHTS

This invention was developed under Contract DE-AC04-94AL85000 between Sandia Corporation and the U.S. Department of Energy. The U.S. Government has certain rights in this invention.

FIELD OF THE INVENTION

The present invention relates in general to arc-fault detection and mitigation in a photovoltaic array. More specifically, this invention not only determines whether an arc-fault exists in a photovoltaic array, but whether the arc-fault is a series type arc-fault or a parallel type arc-fault. Other embodiments are also described and claimed.

BACKGROUND

An arc-fault in a photovoltaic array is an undesirable occurrence where an arc of current is established between two or more conductors, causing a discharge of electricity which may cause a fire. An arc-fault can occur in the photovoltaic array, for example, because of corrosion or issues in installation.

One type of arc-fault is referred to as a series arc-fault. A series arc-fault is created when there is a discontinuity in a conductor and current bridges this gap. A series arc-fault is de-energized by opening the circuit.

Another type of arc-fault is referred to as a parallel arc-fault. A parallel arc-fault is created when an arc is established between conductors at different potentials. For example, an arc between a negative DC cable and a positive DC cable is a parallel arc-fault. In another example, an arc between conductors on different photovoltaic strings at different potentials is a parallel arc-fault. In a further example, an arc within a string where a short circuit occurs, such as in a junction box, is a parallel arc-fault. In contrast to the manner in which a series type arc-fault is de-energized, opening the circuit does not de-energize a parallel type arc-fault. Moreover, attempting to de-energize a parallel arc-fault by opening the circuit can worsen the arc, raising the risk of electrical fire. Parallel arc-faults are mitigated by either (a) shorting the string or array, or (b) by segmenting the array to safe operating voltages where the arc-fault plasma stream becomes unstable and collapses.

The NATIONAL ELECTRICAL CODE is a standard that sets forth safe installation of electrical wiring and equipment in the United States of America. In the 2011 and 2014 versions of the NATIONAL ELECTRICAL CODE, Section 690.11 requires photovoltaic direct current (DC) series arc-fault protection, but does not require parallel arc-fault protection. Accordingly, arc-fault detectors exist in the status quo that detect arc-faults, but these detectors do not differentiate between a series arc-fault and a parallel arc-fault. In addition, arc-fault detectors detect arc-faults regardless of whether they are series or parallel arc-faults. Furthermore, because existing arc-fault detectors do not specify what type of arc-fault is present, a parallel type arc-fault that is detected is simply identified as an arc-fault without regard to type. Seeing as the manner of extinguishing an arc-fault will be to open the circuit, not only does this action not extinguish the parallel arc-fault, but worsens the arc, potentially causing a fire.

It is important for arc-fault detectors to be reliable and accurate as an essential step for minimizing the risk of electrical fire.

SUMMARY

This invention is directed to a sophisticated arc-fault detector. The arc-fault detector of the present invention identifies not only that an arc-fault exists in the photovoltaic array, but also classifies what type of arc-fault exists, whether it is a series arc-fault or a parallel arc-fault. Upon determination of what type of arc-fault exists in the photovoltaic array, an effective de-energizing action can be selected and taken. To de-energize an electrical arc that is of a series type, the approach would be to open the circuit. By contrast, to de-energize an electrical arc that is of a parallel type, one effective approach would be to short circuit the photovoltaic system, but not to open the circuit at a single point as this action would worsen the parallel arc.

In one embodiment of the invention, an arc-fault type classifier differentiates between a series arc-fault and a parallel arc-fault based on the presence of not only arcing noise, but additionally a change in the current and/or voltage level. If there is only arcing noise, but no change in the current and/or voltage level, then the arc-fault that exists is a series type arc-fault. If there is arcing noise accompanied by a change in the current and/or voltage level, then the arc-fault that exists is a parallel type arc-fault. Appropriate de-energizing action proceeds.

In another embodiment of the invention, an arc-fault type classifier checks for arcing noise, but in a different manner from the above embodiment. In this embodiment, the arc-fault type classifier first determines whether there is arcing noise present. If so, the arc-fault type classifier changes the photovoltaic system by inserting additional resistance in the DC circuit. Once that change is implemented, the arc-fault type classifier determines whether arcing noise is still present. If arcing noise is no longer present at this point, then the arc-fault that exists is of a series type. If arcing noise is still present at this point, then the arc-fault that exists is of a parallel type. Upon the determination of arc-fault type, appropriate de-energizing action is then taken.

A further embodiment of the invention is directed to a unique placement of an arc-fault detector within a photovoltaic array loop in relation to placement of series and parallel switches. Here, upon detection of arcing noise, a DC disconnect is opened, which would normally prevent arc-fault noise from reaching the detector. However, in this embodiment, since the arc-fault detector is not located at the inverter, but rather within a loop in the photovoltaic system, the arc-fault detector can still detect arcing noise. Note that in all instances where the term 'inverter' is used in this patent application, any power electronics device could be placed, including DC-AC inverter, charge controller, power optimizer, DC-DC converter, or power conditioner. If arcing noise no longer exists, then the arc-fault type is determined to be of a series type. It is noted that the de-energizing act was already taken by the opening of the DC disconnect. If arcing noise is still present when the DC disconnect is open, then it is concluded that the arc-fault type is of a parallel type. Since the arc-fault was of a parallel type, the opening of the DC disconnect did not distinguish the arc; further action is needed to de-energize the parallel type arc-fault.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

In this section we shall explain several preferred embodiments of this invention with reference to the appended drawings. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description. It is further to be understood that in some embodiments, the drawings may not be drawn to scale.

Figure 1:
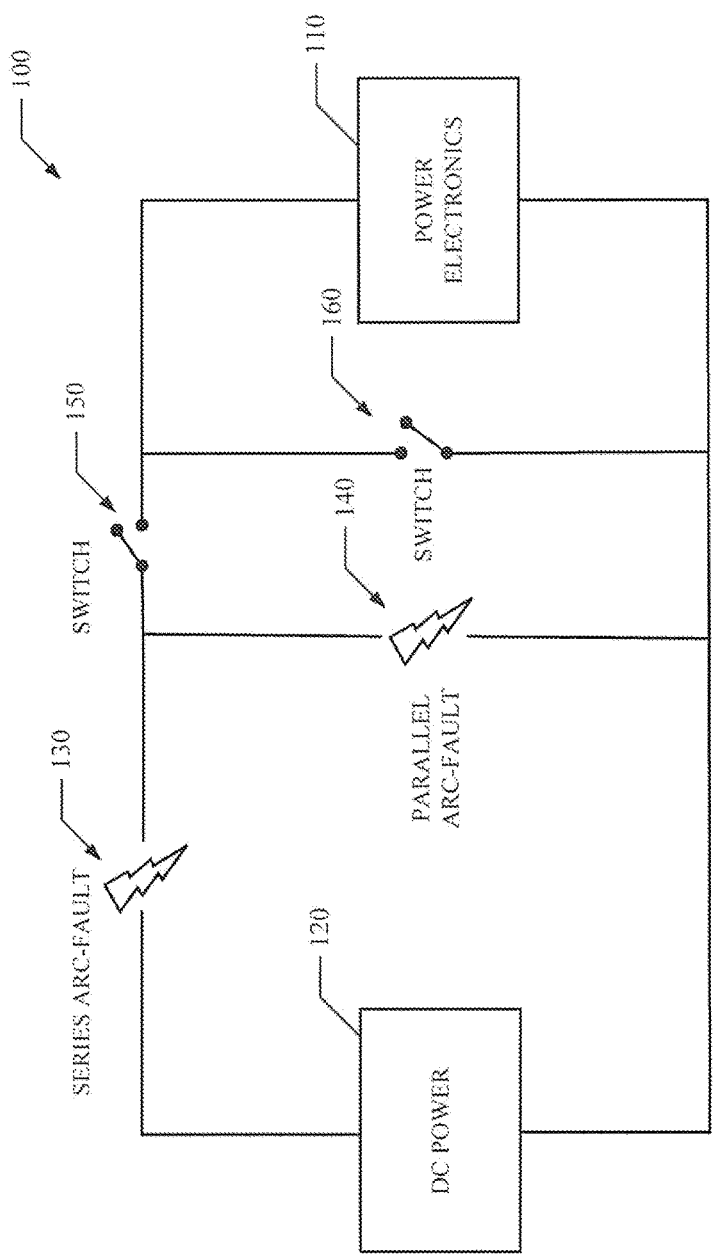
FIG. 1 illustrates in general an overall photovoltaic array system of the present invention.

FIG. 1 illustrates in general an overall photovoltaic array system 100 of the present invention. The photovoltaic array system 100 is one example of how the elements are configured. The system 100 includes DC power 120 and power electronics 110. The power electronics could include a PV inverter, converter, charge controller, or other power conversion device. Examples of a series type arc-fault 130 and a parallel type arc-fault 140 are shown, along with accompanying switches 150, 160 situated differently to tackle the respective different types of arc-faults.

In particular, DC power 120 can be a photovoltaic module. In this embodiment, only one is shown, but a photovoltaic array can have more than one photovoltaic module connected in one or more strings. DC power 120 is connected to power electronics 110, which can be an inverter. Power electronics 110 can include an arc-fault detector. In the present invention, the arc-fault detector can be located at the inverter, combiner box, and as a single module or as multiple detectors.

An example of where a series type arc-fault 130 would appear is shown in FIG. 1 with an accompanying switch 150 placed to extinguish a series arc. It is noted that the switch 150 can alternatively exist in the power electronics 110, e.g., a DC contactor switch within the inverter. An example of where a parallel type arc-fault 140 would appear is also shown in FIG. 1, where a different switch 160 is placed to extinguish a parallel arc. The arc-fault detector of the present invention is capable of determining the presence of both arc-faults 130, 140, as well as identifying that the specific arc-fault types are series and parallel, respectively. Prior to detecting any arc, while the circuit is operating as normal, switch 150 remains closed and switch 160 remains open. Then, when an arc-fault is detected, if the arc-fault that exists is determined to be a series arc-fault 130, then switch 150 (whether existing as shown or within power electronics 110) is opened, thus opening the circuit and extinguishing the series arc. If the arc-fault that exists is determined to be a parallel arc-fault 140, then the action taken is not to open switch 150, but to keep switch 150 closed, and instead close switch 160, thus shorting the circuit and extinguishing the parallel arc. Any useful switches can be incorporated into the system of the invention to electrically connect and/or disconnect portions of the PV array. Exemplary switches include, independently, one or more contactors, semiconductor switches (e.g., insulated gate bipolar transistors (IGBTs) or field effect transistors (FETs), such as metal oxide semiconductor field effect transistors (MOSFETs)), semiconductor devices (power transistors and solid state relays), diodes, fuses, and/or remotely triggered switched devices, as well as combinations thereof.

Figure 2:
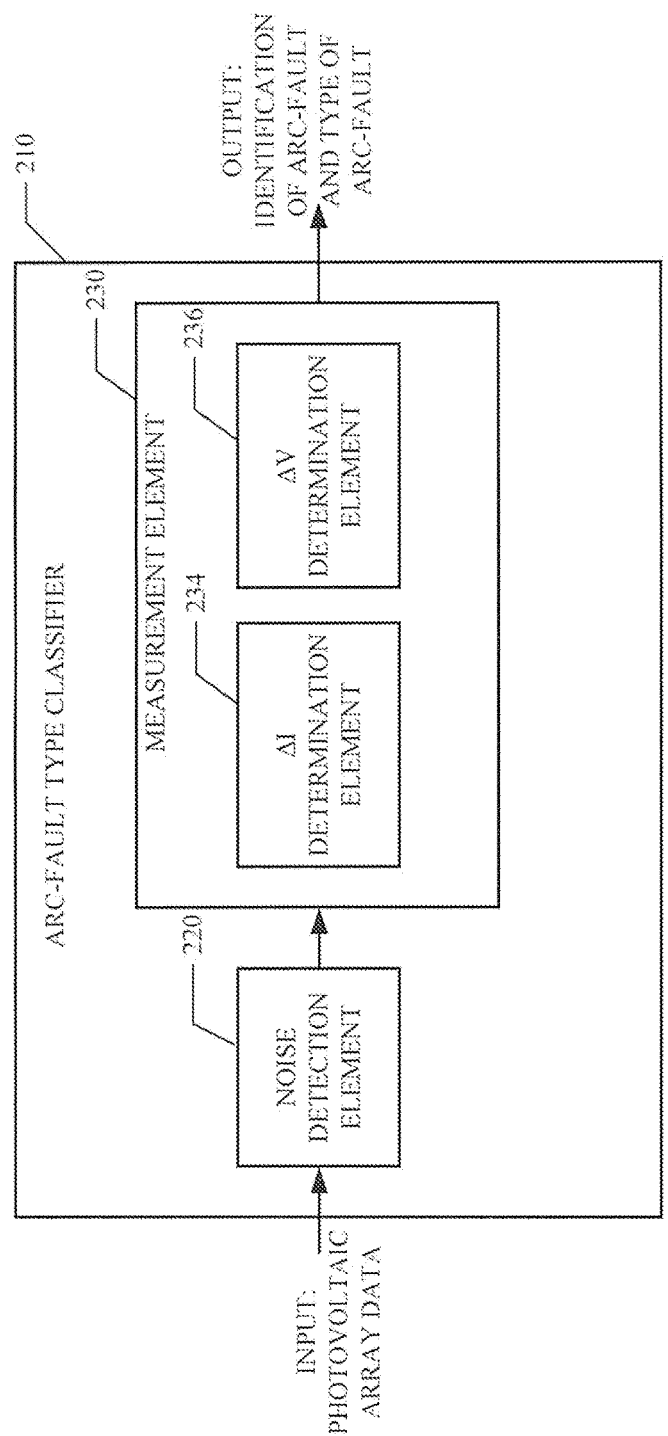
FIG. 2 is a block diagram of one embodiment of an arc-fault type classifier.

FIG. 2 is a block diagram of one embodiment of an arc-fault type classifier. The arc-fault type classifier 210 receives as an input photovoltaic array data and outputs an identification that an arc-fault exists as well as an identification of the specific type of arc-fault, series or parallel. The arc-fault type classifier 210 includes a noise detection element 220 and a measurement element 230. The measurement element 230 includes a change in current determination element 234 and a change in voltage determination element 236.

Within the arc-fault type classifier 210, a noise detection element 220 detects whether there is arcing noise in the photovoltaic array system. Arcing noise is high frequency noise that indicates that some sort of arc-fault exists. The present invention thus identifies the presence of an arc-fault. In one embodiment, the noise detection element 220 is an arc-fault detection element that monitors the photovoltaic array system for arcing via frequency domain techniques, such as fast Fourier transformation, discrete Fourier transformation, wavelet, etc. Arc-fault detection can also utilize time domain techniques to detect arcing.

Moreover, the present invention also identifies the specific type of arc-fault that exists, whether series or parallel type by further analysis beyond detecting arcing noise. The noise detection element 220 communicates with the measurement element 230. Once it has been determined with the noise detection element 220 that an arc-fault of some type exists, the measurement element 230 serves to further analyze the photovoltaic system to identify what type of arc-fault exists. The measurement element 230 includes a change in current (ΔI) determination element 234 and a change in voltage (ΔV) determination element 236, which are indicators of arc-fault type. The ΔI determination element 234 detects whether there has been a change in current; the ΔV determination element 236 detects whether there has been a change in voltage. If such a change exists, then the detected arc-fault is of a parallel type. If such a change does not exist, then the detected arc-fault is of a series type. The measurement element 230 can utilize either a change in current analysis, a change in voltage analysis, or both. Particular photovoltaic array configurations can indicate a tendency to show a change in current or a change in voltage. For example, if a parallel arc existed in a large array with many strings, then the total system voltage would be supported by the other non-affected strings, so a change in voltage would not be very apparent—in this example an analysis of the change in current would more readily identify that a parallel type arc-fault exists. Accordingly, the detector of this type of array should be designed to utilize at least the ΔI determination element 234 to be more effective. Upon analysis by the measurement element 230, the output of arc-fault type classifier 210 is the detection and identification of a specific type of arc-fault in the photovoltaic array, series or parallel.

Figure 3:
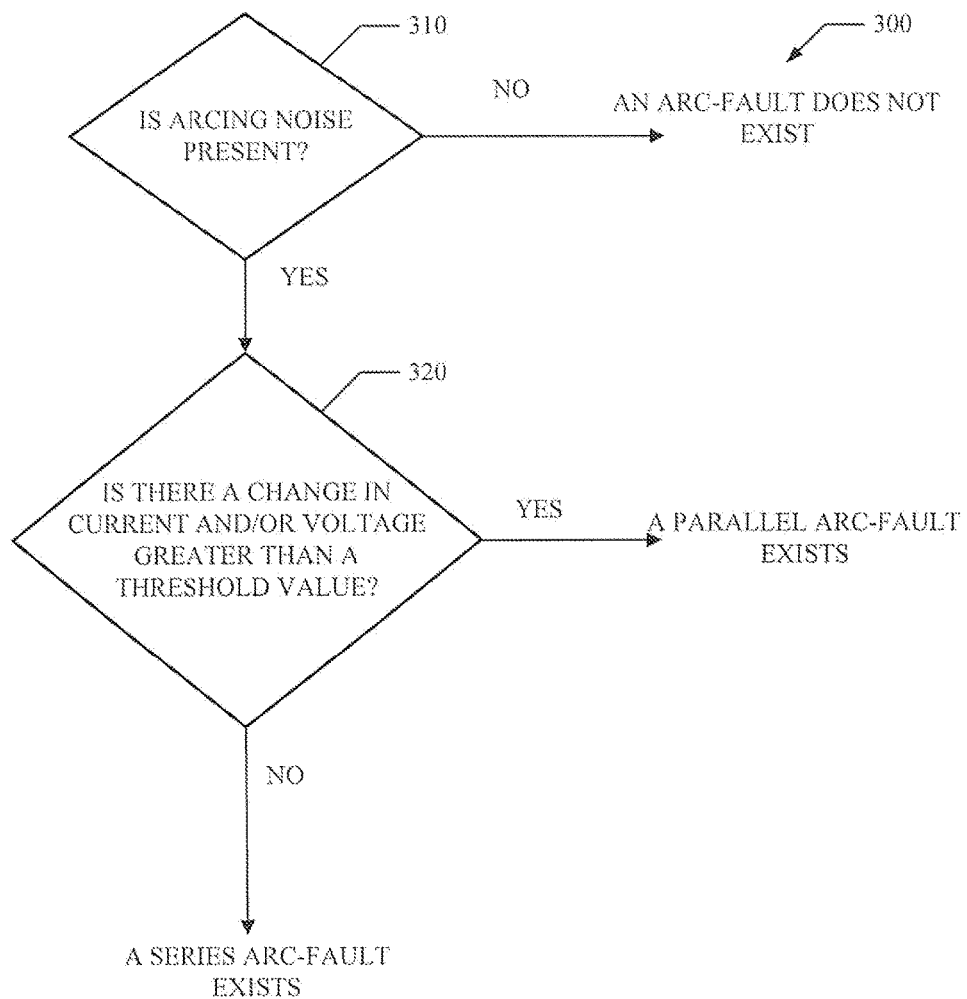
FIG. 3 is a flow diagram of the arc-fault type classifier of FIG. 2.

FIG. 3 is a flow diagram of the arc-fault type classifier of FIG. 2. The operations of FIG. 3 will be described with reference to the embodiment of FIG. 2. However, it should be understood that the operations of this flow diagram can be performed by embodiments of the invention other than those discussed with reference to FIG. 2, and the embodiments discussed with reference to FIG. 2 can perform operations different than those discussed with reference to the flow diagram.

The method 300 of the arc-fault type classifier determines whether arcing noise is present in the photovoltaic array 310. If arcing noise is not present, then an arc-fault does not exist in the photovoltaic array. If arcing noise is present, then an arc-fault exists in the photovoltaic array. At 320, another detection is made on whether there is a change in current and/or voltage greater than a threshold value or percentage change. This delta value is a selected value between 5% to 10% of the maximum current and/or voltage of the array. Dynamic thresholding, e.g., using 5% to 10% of the current and/or voltage at the time of the fault could also be used to determine if the fault is of parallel type. If the delta in current and/or voltage is greater than the selected threshold delta value, then the arc-fault that exists is a parallel type arc-fault. If the delta in current and/or voltage is not greater than the selected threshold delta value, i.e., the change in current and/or voltage is not much, then the arc-fault that exists is a series type arc-fault.

Figure 4A:
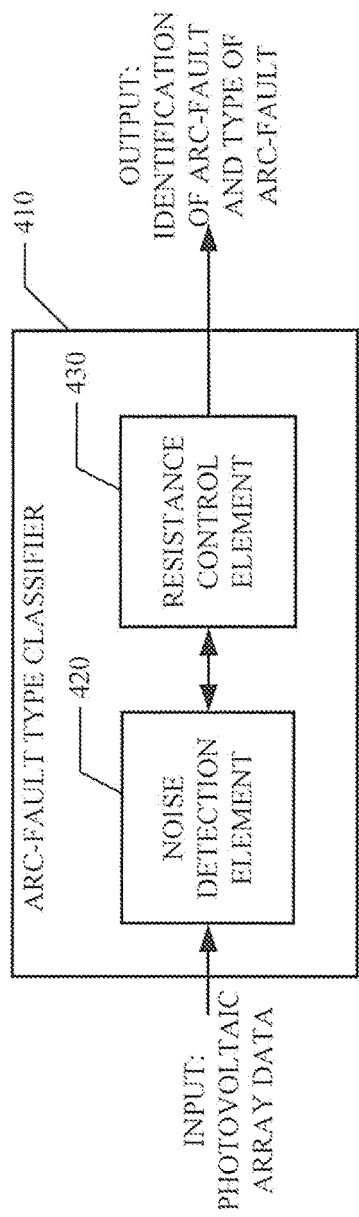
FIG. 4A illustrates a block diagram of another embodiment of an arc-fault type classifier.

FIG. 4A illustrates a block diagram of another embodiment of an arc-fault type classifier. The arc-fault type classifier 410 of this embodiment receives photovoltaic array data as input and outputs an identification that an arc-fault exists as well as an identification of the specific type of arc-fault, series or parallel. The arc-fault type classifier 410 comprises a noise detection element 420 and a resistance control element 430.

Within the arc-fault type classifier 410, a noise detection element 420 detects whether there is arcing noise in the photovoltaic array system. Arcing noise is high frequency noise that indicates that some sort of arc-fault exists. The present invention thus identifies the presence of an arc-fault. In one embodiment, the noise detection element 420 is an arc-fault detection element that monitors the photovoltaic array system for arcing via frequency domain techniques, such as fast Fourier transformation, discrete Fourier transformation, wavelet, etc. Arc-fault detection can also utilize time domain techniques to detect arcing.

Furthermore, the present invention also identifies the specific type (series or parallel type) of arc-fault that exists, through additional steps beyond detecting arcing noise. The noise detection element 420 communicates with the resistance control element 430. The resistance control element 430 adjusts the resistance by increasing it, then checking again whether there is still arcing noise in the photovoltaic array system. It is noted that the resistance control element 430 can exist within the inverter or outside of the inverter, at the positive conductor or the negative conductor or after the combiner. When the equivalent resistance is changed, the operating point of the system is essentially moved. When the resistance is increased to a certain point, then a series arc-fault cannot exist any longer, i.e., an open circuit is a very high resistance as no current can pass through the two points. However, if arcing noise still exists even when the resistance is increased, then the arc-fault type classifier determines that the arc-fault that exists is a parallel type arc-fault. The resistance that is inserted ranges depending on the array size. Generally, the resistance inserted will be 3 to 10 times the inverter equivalent resistance. For instance, a small system will have an inverter resistance of around 60 ohms. The resistance inserted in this case would be approximately 240 ohms. A larger system that has an inverter resistance of approximately 5 ohms would have a resistance inserted of approximately 30 ohms.

Figure 4B:
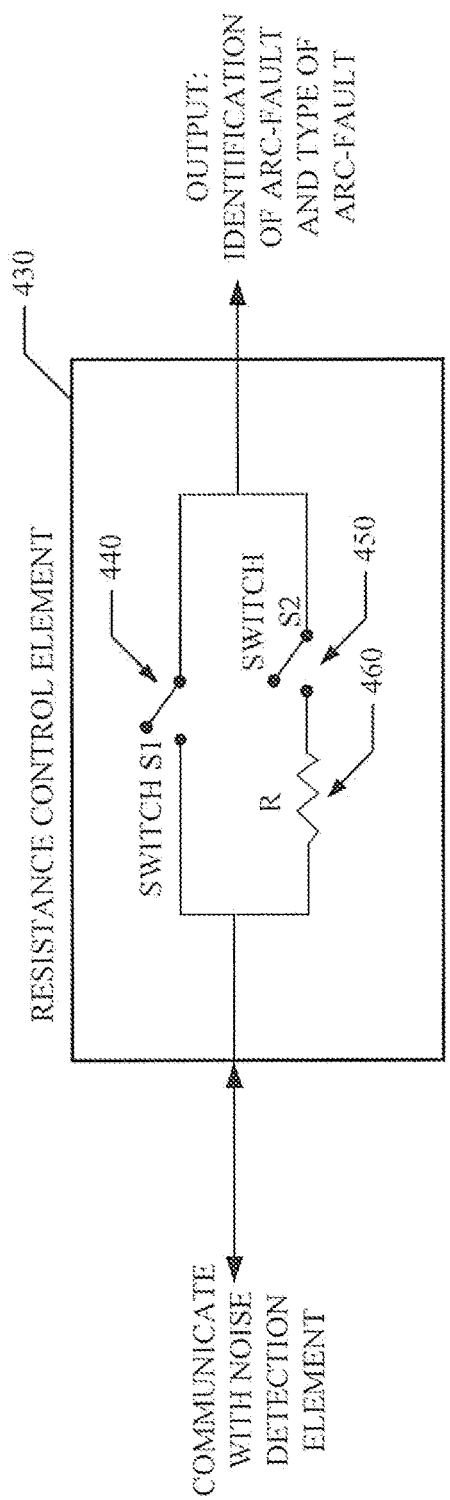
FIG. 4B depicts a block diagram of the resistance control element of FIG. 4A.

FIG. 4B depicts a block diagram of the resistance control element of FIG. 4A. The resistance control element 430 is graphically shown for purposes of understanding. The resistance control element 430 communicates with the noise detection element 420 of FIG. 4A. The resistance control element 430 can be configured such that two current paths are offered, the top path or the bottom path containing resistance R 460. The path that is taken will be controlled by switch S1 440 and switch S2 450.

In normal operation, switch S1 440 is closed and switch S2 450 is open. When the noise detection element 420 detects high frequency arcing noise in the photovoltaic array system which indicates that some type of arc-fault exists, then the resistance control element 430 takes action to further identify the type of arc-fault that is present. The resistance control element 430 opens switch S1 440 and closes switch S2 450. Now, the equivalent resistance is changed, i.e., increased, and another determination is made of whether or not high frequency arcing noise still exists. If the arcing noise is still present, then the arc-fault is determined to be a parallel type arc-fault. If the arcing noise is no longer present, then the arc-fault is determined to be a series type arc-fault. It is noted that the when the arc-fault is of a series type, then this action of opening switch S1 440 and closing switch S2 450 has extinguished the arc; no further de-energizing action needs to be taken. However, if the arc-fault was determined to be of a parallel type, further action does need to be taken to extinguish the parallel arc, such as short circuiting the system. As referenced above with respect to FIG. 4A, the value of the resistance R 460 depends on the size of the photovoltaic array system. In the examples above, a small system having an inverter resistance of around 56 ohms would call for a resistance value of R 460 to be around 150 ohms and a larger system having an inverter resistance of around 5 ohms would call for a resistance value of R 460 to be around 20 ohms.

Additionally, equivalent series resistance may also be artificially inserted into the DC circuit by changing the gate switching operation of the power electronics such that the PV operating point shifts to a lower current, higher voltage point.

Figure 5:
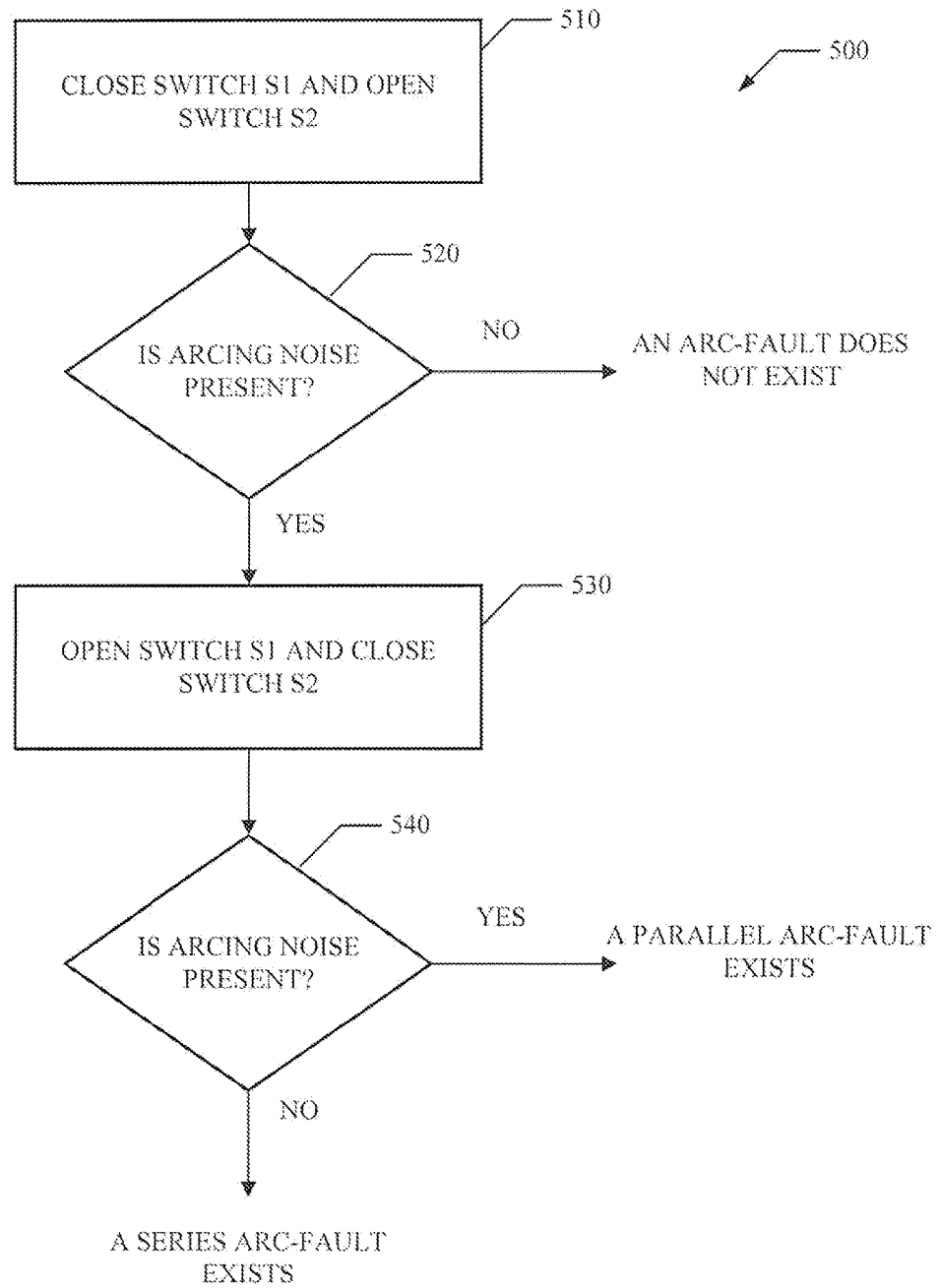
FIG. 5 is a flow diagram of the arc-fault type classifier of FIG. 4A.

FIG. 5 is a flow diagram of the arc-fault type classifier of FIGS. 4A and 4B. The operations of FIG. 5 will be described with reference to the embodiment of FIGS. 4A and 4B. However, it should be understood that the operations of this flow diagram can be performed by embodiments of the invention other than those discussed with reference to FIGS. 4A and 4B, and the embodiments discussed with reference to FIGS. 4A and 4B can perform operations different than those discussed with reference to the flow diagram.

The method 500 of the arc-fault type classifier begins at 510 by ensuring that switch S1 440 is closed and switch S2 450 is open. The arc-fault type classifier continuously monitors for spectral arcing noise in the photovoltaic array system 520. If there is no arcing noise, then an arc-fault does not exist in the system. If arcing noise is present, then an arc-fault of some type is present.

The method 500 proceeds to determine which type of arc-fault it is, series or parallel. The arc-fault type classifier therefore opens switch S1 and closes switch S2, changing the current path in the resistance control element 530 from the top to the bottom and increasing the equivalent resistance according to the value R next to the now closed switch S2. Then a determination is made of whether high frequency arcing noise is still present in the photovoltaic array system 540. If at this point arcing noise is still present, then the arc-fault that exists is of a parallel type. If arcing noise is no longer present, then the arc-fault that existed was of a series type. In the series case, as the opening of switch S1 acted to distinguish the series arc-fault, the series arc is no longer there and additional de-energizing measures do not need to be taken. However, for a parallel arc-fault that has not been de-energized, action still remains to distinguish the parallel arc, e.g., opening the circuit.

Figure 6:
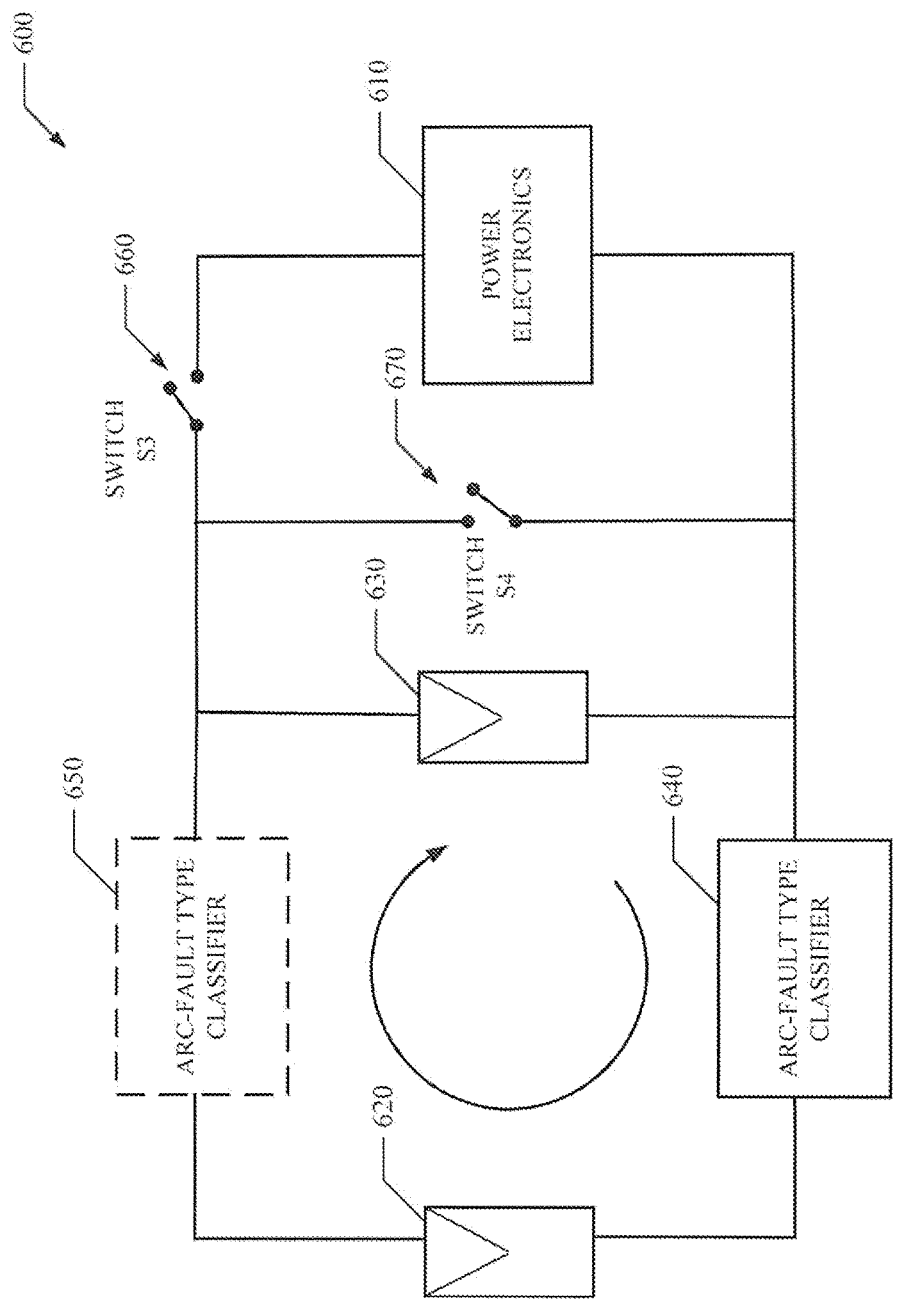
FIG. 6 schematically depicts a diagram of yet another embodiment of an arc-fault type classifier within a photovoltaic array system.

FIG. 6 schematically depicts a diagram of yet another embodiment of an arc-fault type classifier within a photovoltaic array system. This photovoltaic array system 600 contains two photovoltaic modules or panels 620, 630, power electronics 610, an arc-fault type classifier 640, an example of an optional alternative placement of the arc-fault type classifier 650, and two switches 660, 670.

In this embodiment, current transformer/arc-fault type classifier 640 is placed in the loop between the two photovoltaic modules or panels 620, 630 shown in the figure. As an example, the arc-fault type classifier 650 can alternatively be placed at the top part of the loop as shown by the dotted line, as well as anywhere in the loop. One arc-fault type classifier can handle the entire system, though for large systems, more than one arc-fault type classifier can be necessary. It is notable that in this embodiment, the arc-fault type classifier is not located at the power electronics or inverter 610. Therefore, access to program the inverter to accommodate the arc-fault type classifier is not needed. The arc-fault type classifier 640 (and the arc-fault type classifier 650 in the alternative placement) is connected to switch S3 660 and switch S4 670 through a wired or wireless connection so that the arc-fault type classifier 640 can control the on or off state of the switches. Switch S3 660 is situated to extinguish a series type arc-fault and switch S4 670 is situated to extinguish a parallel type arc-fault.

In normal operation where no arc-faults are present in the system, switch S3 660 is closed and switch S4 670 is open. However, upon detection of high frequency arcing noise which indicates that some type of arc-fault exists in the system, the arc-fault type classifier 640 opens switch S3 660. In one embodiment, the arc-fault type classifier 640 is an arc-fault detection element that monitors the photovoltaic array system for arcing via frequency domain techniques, such as fast Fourier transformation, discrete Fourier transformation, wavelet, etc. Arc-fault detection can also utilize time domain techniques to detect arcing.

If arcing noise is still present, then the arc-fault type classifier 640 determines that the arc-fault that exists is of a parallel type, and closes switch S4 670 to extinguish the parallel arc. If arcing noise is no longer present when switch S3 660 is opened, then the arc-fault type classifier 640 determines that the arc-fault that existed was of a series type, and it was already extinguished by the action of opening switch S3 660.

Figure 7:
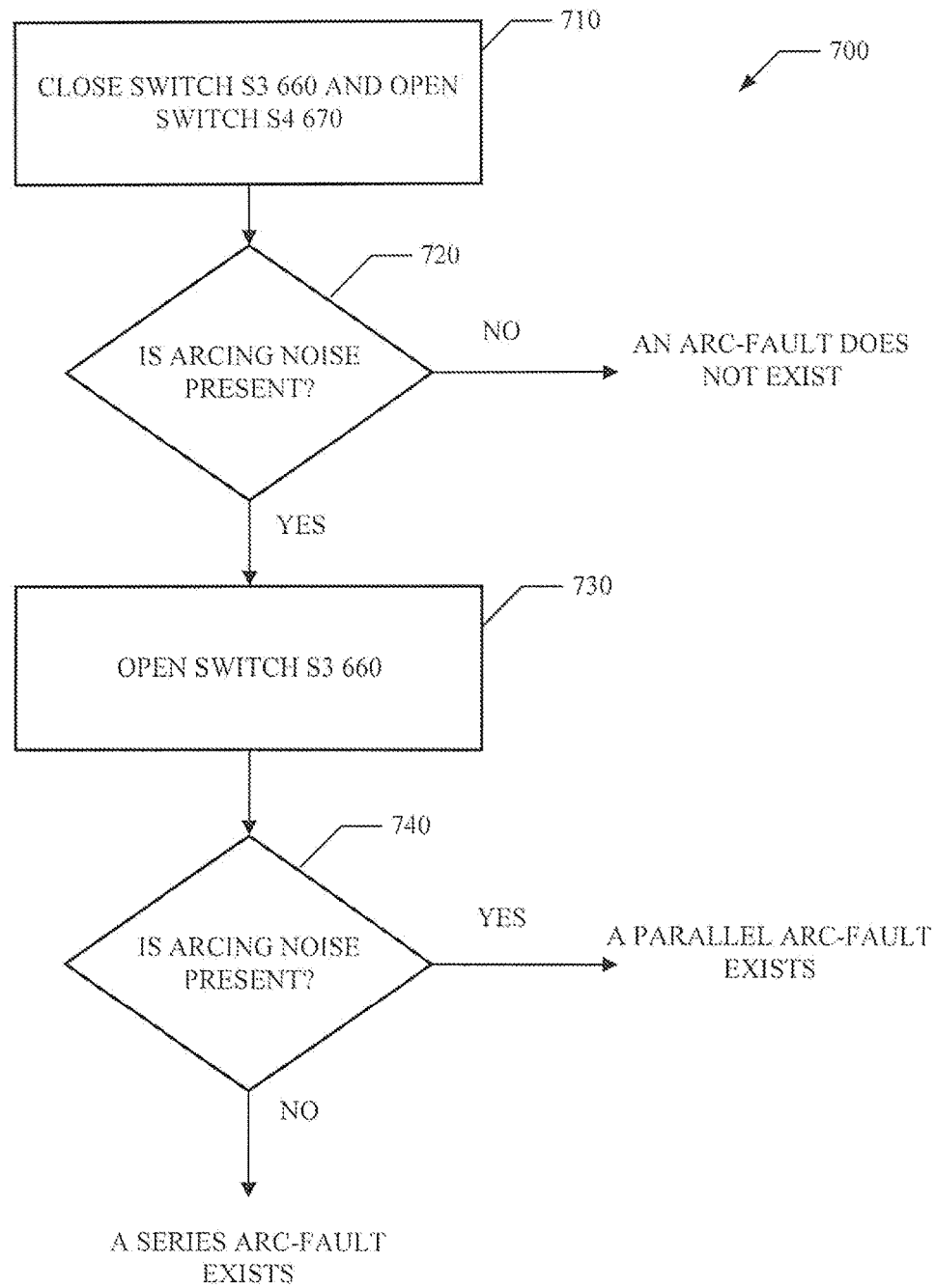
FIG. 7 presents a flow diagram of the arc-fault type classifier of FIG. 6.

FIG. 7 presents a flow diagram of the arc-fault type classifier of FIG. 6. The operations of FIG. 7 will be described with reference to the embodiment of FIG. 6. However, it should be understood that the operations of this flow diagram can be performed by embodiments of the invention other than those discussed with reference to FIG. 6, and the embodiments discussed with reference to FIG. 6 can perform operations different than those discussed with reference to the flow diagram.

The method 700 of the arc-fault type classifier begins at 710, where it is ensured that switch S3 660 is closed and switch S4 670 is open for the normal power generation operation of the PV system. Proceeding to 720, the arc-fault type classifier continuously monitors for high frequency arcing noise in the photovoltaic array system. If there is no arcing noise, then an arc-fault does not exist in the system. If arcing noise is present, then an arc-fault of some type is present.

To determine which type of arc-fault it is, series or parallel, switch S3 660 is switched from closed to open 730. Current is now prevented from reaching the power electronics/inverter. As the arc-fault type classifier is situated within the loop shown in FIG. 6 rather than at the inverter, the arc-fault type classifier continues to monitor whether arcing noise is present in the system 740. If arcing noise is not present in the system, then the arc-fault that existed was a series arc-fault and already extinguished by the opening of switch S3. If arcing noise is present in the system, then the arc-fault that exists is a parallel arc-fault and further measures still need to be taken to extinguish the parallel arc. Closing switch S4 of FIG. 6 extinguishes such arc.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention. The description is thus to be regarded as illustrative instead of limiting.

What is claimed is:

1. An arc-fault type classifier device comprising:
    an arc-fault detection element that monitors a photovoltaic array system for arcing via frequency domain techniques; and
    a measurement element that monitors the photovoltaic array system for a change in current or a change in voltage upon notification from the arc-fault detection element that the arcing exists in the photovoltaic array system, wherein the measurement element classifies the arc-fault as a series arc fault or a parallel arc fault based on the change in current or the change in voltage monitored; and wherein the measurement element compares the change in current to a current threshold value or percentage and the change in voltage to a voltage threshold value or percentage; and wherein the measurement element determines that the type of arc-fault is series when the change in current does not exceed the current threshold value or the change in voltage does not exceed the voltage threshold value or wherein the measurement element determines that the type of arc-fault is parallel when the change in current exceeds the current threshold value or the change in voltage exceeds the voltage threshold value.

2. The arc-fault type classifier device of claim 1, wherein the measurement element utilizes information from both the change in current and the change in voltage.

3. An arc-fault type classifier device comprising:
    an arc-fault detection element that monitors a photovoltaic array system for an arcing signature via frequency domain techniques; and
    a resistance control element that modifies an equivalent resistance of the photovoltaic array system and monitors the photovoltaic array system for the arcing signature with the modified equivalent resistance to identify a type of arc-fault based on a presence of the arcing signature in the photovoltaic array system; wherein the arc-fault detection element comprises a measurement element that compares the change in current to a current threshold value or percentage and the change in voltage to a voltage threshold value or percentage; and wherein the measurement element determines that the type of arc-fault is series when the change in current does not exceed the current threshold value or the change in voltage does not exceed the voltage threshold value or wherein the measurement element determines that the type of arc-fault is parallel when the change in current exceeds the current threshold value or the change in voltage exceeds the voltage threshold value.

4. The arc-fault type classifier device of claim 3, wherein the measurement element determines that the type of arc-fault is series when the arcing signature disappears upon the measurement element increasing the equivalent resistance of the photovoltaic array system.

5. The arc-fault type classifier device of claim 3, wherein the measurement element determines that the type of arc-fault is parallel when the arcing signature remains upon the measurement element increasing the equivalent resistance of the photovoltaic array system.

6. The arc-fault type classifier device of claim 3, existing at an inverter of the photovoltaic array system.

7. A photovoltaic array system comprising:
    a first photovoltaic module;
    a second photovoltaic module connected in parallel to the first photovoltaic module;
    an inverter connected in parallel to the first photovoltaic module and the second photovoltaic module; and
    an arc-fault type classifier located within a loop created by the connection of the first photovoltaic module and the second photovoltaic module, wherein the arc-fault type classifier monitors the photovoltaic array system for an arcing signature with a frequency-based method to identify a type of arc-fault based on a presence of the arcing signature in the photovoltaic array system; and wherein the arc-fault classifier comprises an arc-fault detection element comprising a measurement element that compares the change in current to a current threshold value or percentage and the change in voltage to a voltage threshold value or percentage; and
wherein the measurement element determines that the type of arc-fault is series when the change in current does not exceed the current threshold value or the change in voltage does not exceed the voltage threshold value or
wherein the measurement element determines that the type of arc-fault is parallel when the change in current exceeds the current threshold value or the change in voltage exceeds the voltage threshold value.

8. The photovoltaic array system of claim 7, further comprising:
    a first switch between the first photovoltaic module and the inverter, wherein the first switch is also between the second photovoltaic module and the inverter; and
    a second switch connected in parallel to the first photovoltaic module and the second photovoltaic module.

9. The photovoltaic array system of claim 8, wherein the first switch is closed and the second switch is open.

10. The photovoltaic array system of claim 8, wherein the arc-fault type classifier determines that the type of arc-fault is series when the arcing signature disappears upon opening the first switch.

11. The photovoltaic array system of claim 8, wherein the arc-fault type classifier determines that the type of arc-fault is parallel when the arcing signature remains upon opening the first switch.

12. The photovoltaic array system of claim 11, wherein upon the arc-fault type classifier determining that the type of arc-fault is parallel, the arc-fault type classifier closes the second switch to de-energize the arc-fault.

* * * * *